(12) United States Patent
Rawat et al.

(10) Patent No.: US 9,311,990 B1
(45) Date of Patent: Apr. 12, 2016

(54) PSEUDO DUAL PORT MEMORY USING A DUAL PORT CELL AND A SINGLE PORT CELL WITH ASSOCIATED VALID DATA BITS AND RELATED METHODS

(71) Applicant: STMicroelectronics International N.V., Amsterdam (NL)

(72) Inventors: Harsh Rawat, Faridabad (IN); Piyush Jain, Ghaziabad (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 14/573,106

(22) Filed: Dec. 17, 2014

(51) Int. Cl.
*G11C 11/40* (2006.01)
*G11C 11/419* (2006.01)
*G11C 11/418* (2006.01)

(52) U.S. Cl.
CPC ............ *G11C 11/419* (2013.01); *G11C 11/418* (2013.01)

(58) Field of Classification Search
CPC ... G11C 11/418; G11C 11/419; G11C 11/412
USPC ........................... 365/154, 156, 189.2, 230.05
See application file for complete search history.

(56) References Cited

U.S. PATENT DOCUMENTS

| | | | |
|---|---|---|---|
| 8,374,050 B2 * | 2/2013 | Zhou | G11C 8/16 365/230.03 |
| 8,645,609 B2 * | 2/2014 | Ko | G11C 7/1075 711/104 |
| 8,671,262 B2 | 3/2014 | Minne | |

* cited by examiner

*Primary Examiner* — Tant T. Nguyen
(74) *Attorney, Agent, or Firm* — Allen, Dyer, Doppelt, Milbrath & Gilchrist, P.A.

(57) ABSTRACT

A pseudo dual port memory includes a set of dual port memory cells having a read port and a write port, and configured to store data words in each of a plurality of addressed locations, and a set of single port memory cells having a read/write port, and configured to store data words in each of a plurality of addressed locations. A valid data storage unit is configured to store valid bits corresponding to the addressed locations of the set of dual port memory cells and the set of single port memory cells. Control circuitry is configured to access the addressed locations of the set of dual port memory cells and the set of single port memory cells. The control circuitry performs a simultaneous write operation using the write port of the set of dual port memory cells and the read/write port of the set of single port memory cells, and updates corresponding valid bits in the valid data storage unit, and performs a parallel read operation, at a same addressed location of the set of dual port memory cells and the set of single port memory cells, using the read port of the set of dual port memory cells and the read/write port of the set of single port memory cells, and determining which stored data word is valid based upon the corresponding valid bits in the valid data storage unit.

22 Claims, 5 Drawing Sheets

PSEUDO DUAL PORT MEMORY USING A DUAL PORT CELL AND A SINGLE PORT CELL WITH ASSOCIATED VALID DATA BITS AND RELATED METHODS

FIELD OF THE INVENTION

The present invention relates to the field of integrated circuits, and, more particularly, to dual port memories and related methods.

BACKGROUND

Static random access memory (SRAM) is commonly used in integrated circuits. SRAM cells have the advantageous feature of holding data without a need for refreshing. SRAM cells may include different numbers of transistors, and are often referred to by the number of transistors, for example, six-transistor (6T) SRAM cell, eight-transistor (8T) SRAM cell, and the like. The transistors typically form a data latch for storing a bit. Additional transistors may be added to control access to the transistors. SRAM cells are typically arranged as an array having rows and columns. Each row of the SRAM cells is connected to a word-line, which determines whether the current SRAM cell is selected or not. Each column of the SRAM cells is connected to a bit-line (or a pair of complementary bit-lines), which is used for writing a bit into, or reading a bit from, the SRAM cell.

Generally, electronic circuits have a significant data storage capacity. Such a capacity is reached with large memories formed of several memory blocks for physical or logical reasons. A memory controller enables the other functions of the electronic circuit to see all the memory blocks as a single memory, in terms of address.

Memory blocks may have a single-port architecture. In other words, as seen from the other electronic circuit functions, a single-port block can only perform one read operation or one write operation at the same time. This memory block architecture enables avoiding too complex memory architectures, or architectures consuming too much circuit surface area. However, it may sometimes be desirable for some functions of the electronic circuit to simultaneously perform a read operation and a write operation, with no address constraint.

A known approach to this problem is to use dual-port memories capable of performing two operations at the same time. The disadvantages of dual-port memories may be their low densities and high access times. Such memories may be poorly adapted to the storage of large data words.

Typically, an SRAM cell includes two pass-gate transistors, through which a bit can be read from or written into the SRAM cell. This type of SRAM cell is referred to as a single port SRAM cell. Another type of SRAM cell is referred to as dual port SRAM cell, which includes four pass-gate transistors.

With two ports, the bit stored in the SRAM cell can be read from port-A and port-B simultaneously. This allows for parallel operations by different applications. Moreover, if a first SRAM cell and a second SRAM cell are in a same column or a same row, a read operation to the first SRAM cell can also be performed simultaneously with a write operation on the second SRAM cell.

Basic SRAM architectures are based on various bit cells available, for example, a single port memory can be built with 6T cells and dual port memory can be built from 8T cells. There are 2 types of dual port 8T cells available, in one type one port can only do read and the other port can only do write at the same time and it may be referred to as 1R1W, while in the other type of 8T cell each port is capable of doing both read or write at the same time and it is referred to as 2R2W.

Often, a pure 2R2W is not needed, but two ports supporting write simultaneously and only one port for read and write simultaneously is needed instead. In such scenarios one approach is to use 2R2W memory as a 2W/1R2W but this approach uses 2R2W bit cells which may be difficult cells to design and control both at process level (stability) and design level (contention of address between two ports leading to performance penalty).

Pseudo dual port memories are possible using 6T cells that may perform two operations in one clock cycle, for example, using both the positive and negative edge of the clock to perform two operations or generating internal logic to enable two operations with the positive edge of the clock. However, the disadvantages of such an approach include the frequency being less than half, using both edges of clock is not preferred since both the edges are not aligned at the system-on-chip (SoC) level (e.g. clock jitters/skew), and also sequencing of operations is complex for internal logic.

There are other approaches in which multiple single port memories use a complex contention handling logic to realize multi port operations (e.g. U.S. Pat. No. 8,671,262 to the present Assignee). But, multiple cycles are used to handle contention and such approaches are not single cycle. The frequency can be on the order of a base single port memory, but the approaches need complex handling logic, and also do not provide single cycle operation, e.g. an operation is distributed across multiple clock cycles (i.e. latency is by default).

SUMMARY

The present embodiments provide a pseudo dual port memory that does not require the use of 2R2W memory cells and provides single cycle operation. The pseudo dual port memory includes a set of dual port memory cells having a read port and a write port, and configured to store data words in each of a plurality of addressed locations; a set of single port memory cells having a read/write port, and configured to store data words in each of a plurality of addressed locations; a valid data storage unit configured to store valid bits corresponding to the addressed locations of the set of dual port memory cells and the set of single port memory cells; and control circuitry configured to access the addressed locations of the set of dual port memory cells and the set of single port memory cells, and the valid data storage unit. The control circuitry performs a simultaneous write operation (e.g. two writes) using the write port of the set of dual port memory cells and the read/write port of the set of single port memory cells, and updates corresponding valid bits in the valid data storage unit, and performs a parallel read operation, at a same addressed location of the set of dual port memory cells and the set of single port memory cells, using the read port of the set of dual port memory cells and the read/write port of the set of single port memory cells, and determining which stored data word is valid based upon the corresponding valid bits in the valid data storage unit.

The simultaneous write operation may be performed in a single clock cycle. The parallel read operation may be performed in a single clock cycle. The set of dual port memory cells may comprise a matrix of 8T memory cells coupled together via word lines and bit lines. The set of single port memory cells may comprise a matrix of 6T memory cells coupled together via word lines and bit lines. The valid data storage unit may comprise a plurality of flip flop circuits.

Also, the number of valid bits of the valid data storage unit may correspond to the number of stored data words of the set of dual port memory cells and the set of single port memory cells.

Another aspect is directed to a dual port SRAM architecture comprising a pseudo dual port memory core comprising a matrix of memory cells coupled in rows and columns. The matrix includes a set of dual port memory cells configured to store data words in each of a plurality of addressed locations, and a set of single port memory cells configured to store data words in each of a plurality of addressed locations. A valid data storage unit is configured to store valid bits corresponding to the addressed locations of the set of dual port memory cells and the set of single port memory cells. Control circuitry, in connection with the row decoder and column decoder, is configured to access the addressed locations of the set of dual port memory cells and the set of single port memory cells by: performing a simultaneous write operation at respective addressed locations of the set of dual port memory cells and the set of single port memory cells, and updating corresponding valid bits in the valid data storage unit; and performing a parallel read operation, at a same addressed location of the set of dual port memory cells and the set of single port memory cells, and determining which stored data word is valid based upon the corresponding valid bits in the valid data storage unit (and thus operating as a 2W/1R1W memory).

A method aspect is directed to implementing a pseudo dual port memory. The method comprises addressing locations in a set of dual port memory cells having a read port and a write port, and in a set of single port memory cells having a read/write port, to store data words therein; and storing valid bits, corresponding to the addressed locations of the set of dual port memory cells and the set of single port memory cells in a valid data storage unit. The method includes accessing, with control circuitry, the addressed locations of the set of dual port memory cells and the set of single port memory cells by: performing a simultaneous write operation using the write port of the set of dual port memory cells and the read/write port of the set of single port memory cells, and updating corresponding valid bits in the valid data storage unit; and performing a parallel read operation, at a same addressed location of the set of dual port memory cells and the set of single port memory cells, using the read port of the set of dual port memory cells and the read/write port of the set of single port memory cells, and determining which stored data word is valid based upon the corresponding valid bits in the valid data storage unit.

DETAILED DESCRIPTION

The present invention will now be described more fully hereinafter with reference to the accompanying drawings, in which preferred embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
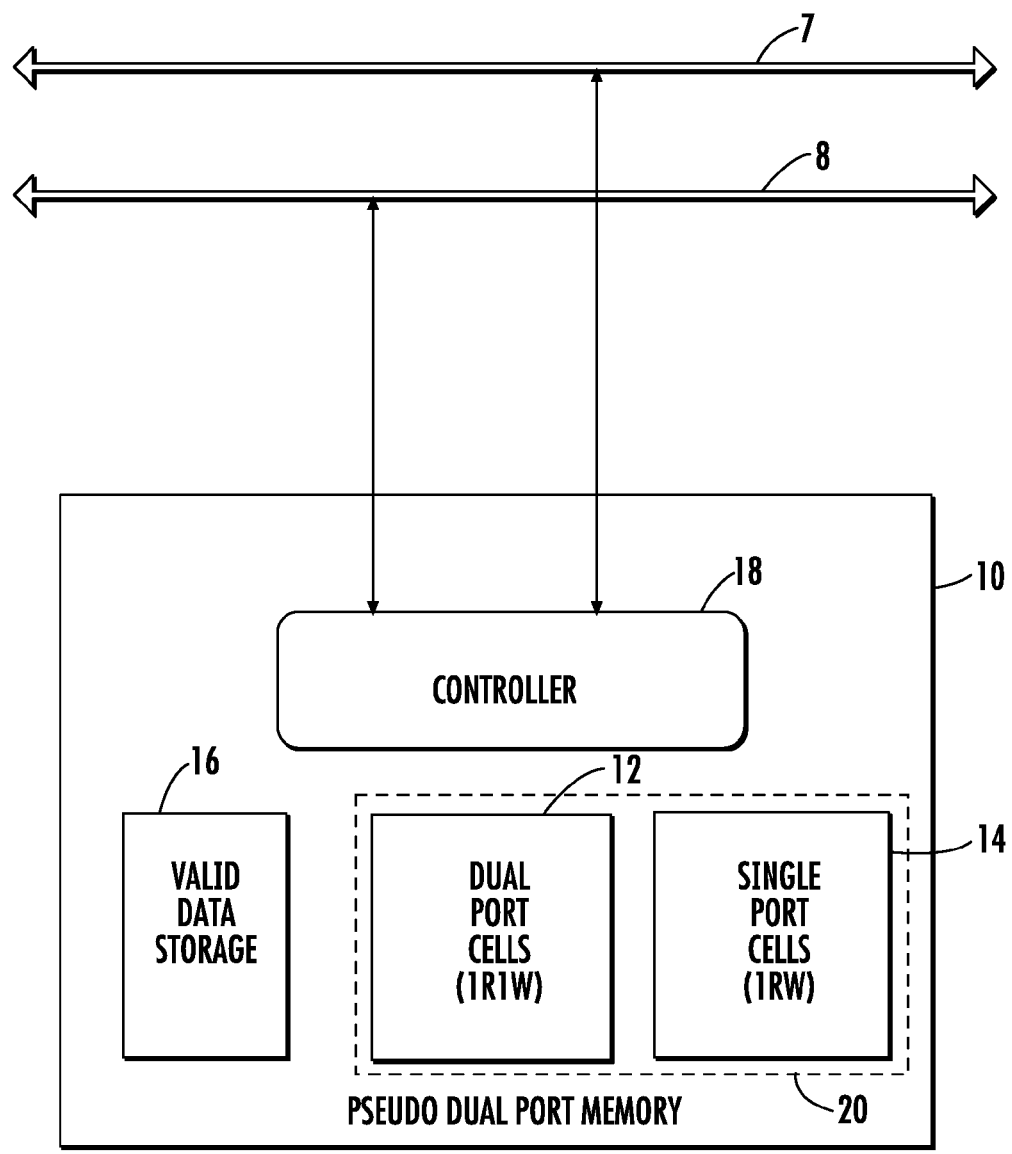
FIG. 1 is a schematic diagram illustrating a pseudo dual port memory in accordance with features of the present embodiments.
Figure 2:
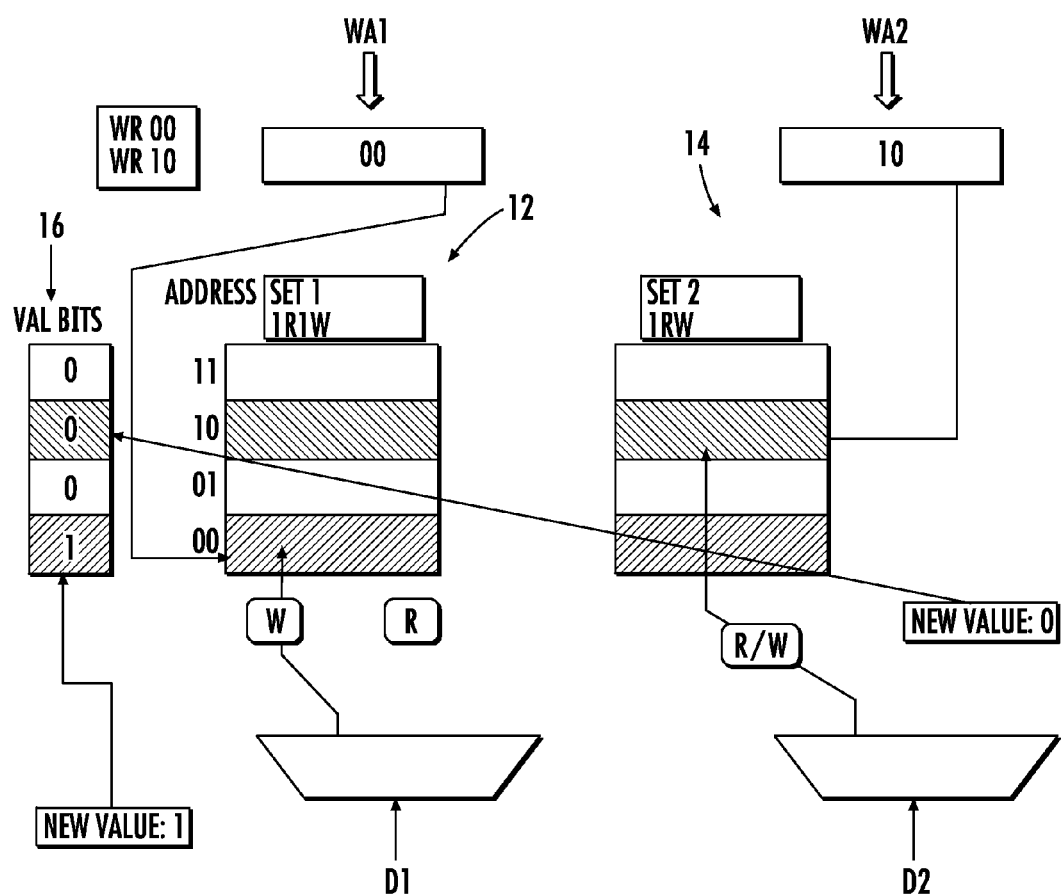
FIG. 2 is a schematic diagram illustrating portions of a simultaneous write operation in the pseudo dual port memory of FIG. 1.
Figure 3:
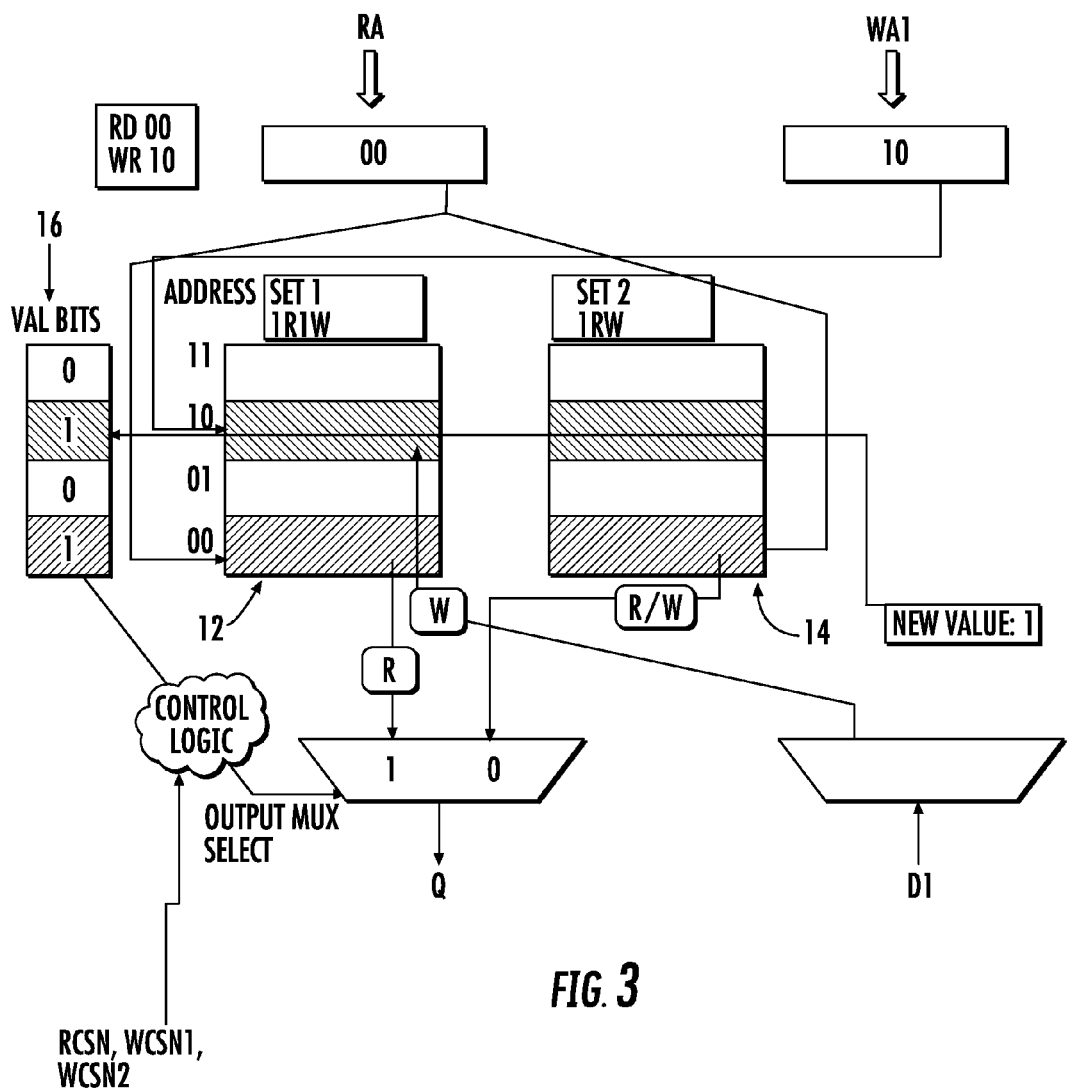
FIG. 3 is a schematic diagram illustrating portions of a write and parallel read operation in the pseudo dual port memory of FIG. 1.

Referring initially to FIGS. 1-3, a pseudo dual port memory 10, such as an SRAM, will be described. The pseudo dual port memory 10 may include a set 12 of dual port memory cells having a read port R and a write port W, and configured to store data words in each of a plurality of addressed locations (e.g. 00, 01, 10, 11). The set 12 of dual port memory cells may comprise a matrix of 8T memory cells coupled together, for example, via word lines and bit lines (not shown). A set 14 of single port memory cells has a read/write port R/W, and is configured to store data words in each of a plurality of addressed locations (e.g. 00, 01, 10, 11). The set 14 of single port memory cells may comprise a matrix of 6T memory cells coupled together, for example, via word lines and bit lines. The sets 12, 14 of memory cells may define a memory core 20.

A valid data storage unit 16 is configured to store valid bits corresponding to the addressed locations of the set 12 of dual port memory cells and the set 14 of single port memory cells. The valid data storage unit 16 may be implemented with a plurality of flip flop circuits, or may include the use of a customized memory since output of this memory is only required at the end of the cycle. A controller 18 or control circuitry is configured to access the addressed locations of the set 12 of dual port memory cells and the set 14 of single port memory cells, and also access the valid storage unit 16. The controller 18 may be connected to portions of a host electronic circuit, for example, via data buses 7, 8. The controller 18 may perform the address coding and decoding operations to access the sets 12, 14 of memory cells.

So, the embodiments provide a 2W/1R1W memory without using 2R2W cells, and also improve the performance so that it can be both cost and performance effective. Typically, 1R1W and 1RW memories are readily available and are better in performance than 2R2W memories. The present embodiments have the flexibility of keeping data at two locations and keeping a valid bit associated with each location to indicate the validity of existing data. Such a 2W/1R1W memory supports a single read at a time and thus whenever the read operation is requested, both the memory sets 12, 14 are read from, and the output is decided based on the valid bit, e.g. corresponding to the read address. In the present example, a "1" may be stored in the valid data storage unit 16 corresponding to the write address if a write is performed on the 1R1W memory, or else a "0" is stored for the 1RW memory.

Whenever two writes are requested, one write is performed on the dual port cells 12 (i.e. the 1R1W memory) at WA1 and a second write is performed on the single port cells 14 (i.e. the 1RW memory) at WA2 at the same time (i.e. simultaneously or during a same clock cycle). Thus for this operation, a "1" is written in the valid data storage unit 16 corresponding to the write address WA1 and a "0" is written into the valid data storage unit 16 corresponding to WA2. In a case of WA1=WA2 control logic can be configured to give priority to any one of the addresses.

Whenever read and write come together, one approach could be to read valid data and identify beforehand which memory to read and then direct write operation to the other memory. By using the 1R1W memory, complex setup paths are avoided by performing a read operation from both 1R1W and 1RW memory at the read address and selecting an output based on the valid bit at end of the operation (in present example 1 means select output of 1R1W and 0 means select output of 1RW memory), and performing write operation on 1R1W memory. This sequencing of operation avoids the need for valid data information at the end of the read operation, and avoiding setup of valid data before active clock edge. For every write operation, corresponding valid bits for that write addresses are updated for both the 1R1W and 1RW memory sets 12, 14 as explained above for two write operations.

In the present architecture, the valid bit contents (i.e. valid bits) can be stored in synchronous memories since output of this memory is used at the end of the cycle not before the cycle. Thus, the valid data storage 16 can be implemented using a Flip Flop array (FF array) but a custom memory may also be used. The initial state of valid bits can be any, during valid write it will get updated. There is no need for initialization of valid bits in this architecture.

Operations of the pseudo dual port memory 10 include: 2W—perform one write operation on 1R1W memory and a second write operation on 1RW memory and update the corresponding valid bits; 1R1W—perform a read operation from both 1R1W and 1RW memory at the read address and select an output based on valid bit and update valid bits for corresponding write address, and perform a write operation on 1R1W memory; 1R—perform a read operation on both 1R1W and 1RW memory and select an output based on valid bit (the flow is the same as in the read operation under 1R1W); and 1W—perform a write on either of the two memories (the flow is the same as in the 2W operation) and update valid bits for corresponding write address.

Referring more specifically to the diagram in FIG. 2, the controller 18 performs the simultaneous write operation (e.g. data D1 to write address WA1, and data D2 to write address WA2) using the write port W of the set 12 of dual port memory cells and the read/write port R/W of the set 14 of single port memory cells, and updates corresponding valid bits in the valid data storage unit 16. The controller 18 performs a parallel read operation for any requested read operation (it should noted that there is no 2R functionality as discussed above).

Referring more specifically to FIG. 3, a 1R1W operation (read data Q at read address RA, and write data D1 at write address WA1) will be described. The read operation is performed at a same addressed location (e.g. 00) of the set 12 of dual port memory cells and the set 14 of single port memory cells, using the read port R of the set of dual port memory cells and the read/write port R/W of the set of single port memory cells, and the valid stored data word is determined based upon the corresponding valid bits in the valid data storage unit 16. The requested write WA1 of the 1R1W operation is performed at the addressed location (e.g. 10) of the set 12 of dual port memory cells.

The simultaneous write operation may be performed in a single clock cycle. The parallel read operation may be performed in a single clock cycle. Also, the number of valid bits of the valid data storage unit 16 may correspond to the number of stored data words of the set 12 of dual port memory cells and the set 14 of single port memory cells.

Figure 4:
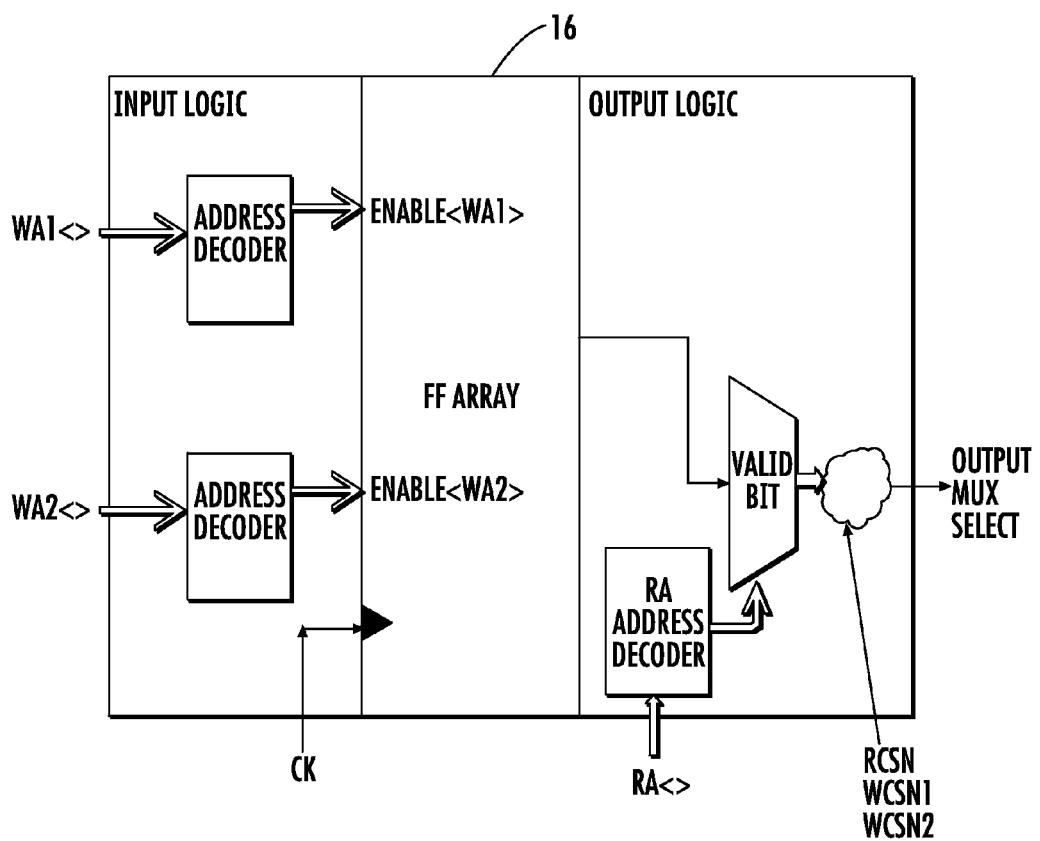
FIG. 4 is a schematic diagram illustrating the logic for the valid data storage of the pseudo dual port memory of FIG. 1.

Referring to FIG. 4, the logic of the valid data storage 16 is described. The purpose of valid data storage unit 16 is to store for each address its actual location. Hence there will be address number of valid data, for example Flip Flops (equal to number of addresses of memory) are used here to store valid data. In the present example we have two locations corresponding to two memories (1R1W and 1RW) and actual data corresponding to external address is present in any one of the two. We have used 1R1W memory ID as "1" and 1RW memory ID as "0". If Write operation is performed in 1R1W memory for WA1 address then corresponding Valid data location, in present case a Flip-flop, is written with "1" else for write operation done on 1RW memory for WA2 address corresponding valid data location is written with "0". In the present example to support two write operations at a time, at max two valid data location (e.g. two Flip-flops in present case) need to be updated for WA1 and WA2 respectively. This is done by generating Enable signal for only two Flops corresponding to WA1 and WA2 by using decoders as shown in the figure (as Enable1 and Enable2) and writing "1" if write operation done on 1R1W and writing "0" if write operation is done on the 1RW memory. In case of read operation, output of the read address (RA1 in present example) flop is used to select between the output of the two memories only in case of valid read operation (determined through RCSN, WCSN1, WCSN2) otherwise the Output select signal is not changed, as shown in the figure.

Figure 5:
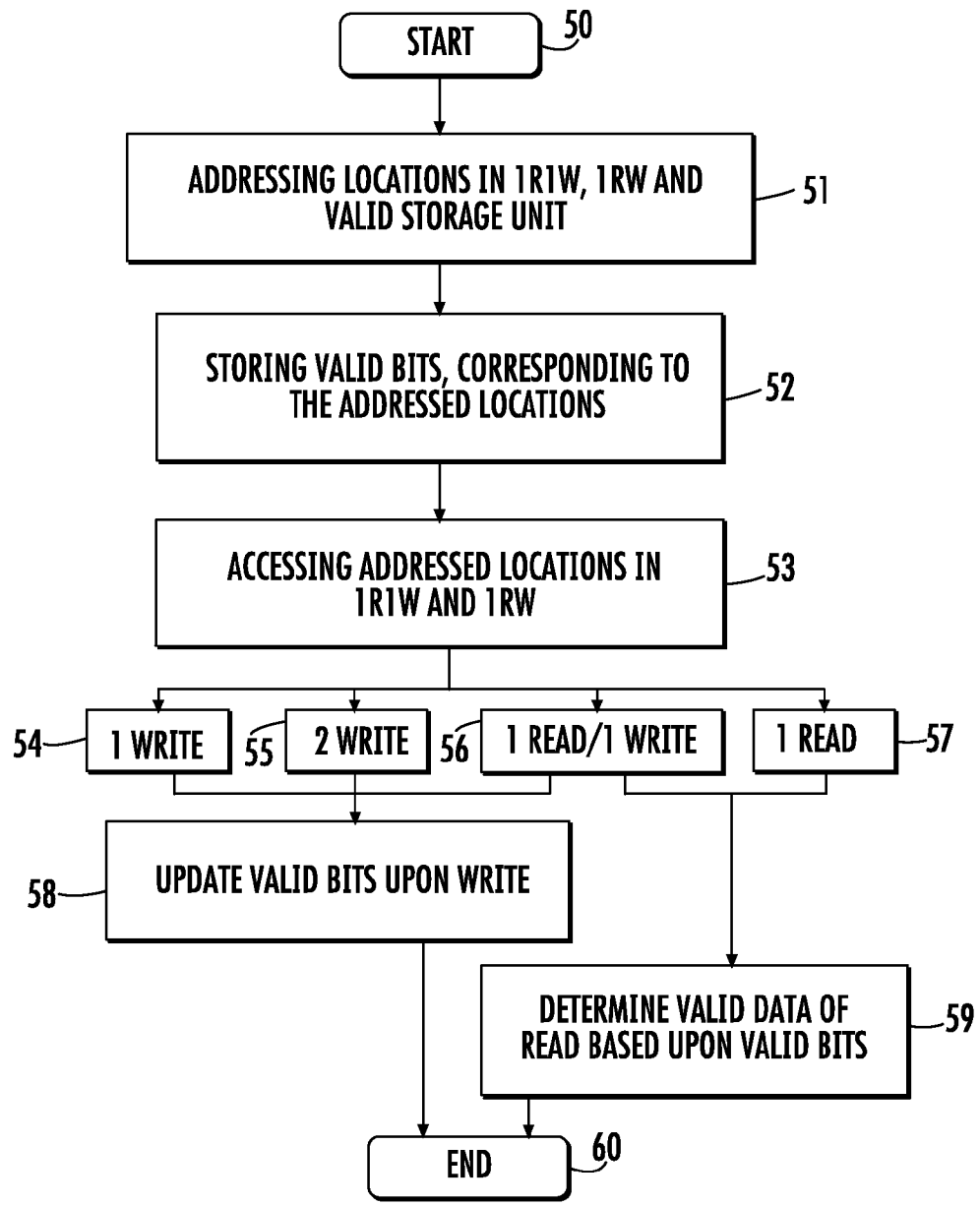
FIG. 5 is a flow chart illustrating a method of implementing a pseudo dual port memory in accordance with features of the present embodiments.

A method aspect is directed to implementing a pseudo dual port memory 10 and is described with additional reference to FIG. 5. The method begins at block 50 and includes at block 51 addressing locations in a set 12 of dual port memory cells having a read port R and a write port W, and in a set 14 of single port memory cells having a read/write port R/W to store data words therein. The method includes, at block 52, storing valid bits, corresponding to the addressed locations of the set 12 of dual port memory cells and the set 14 of single port memory cells in a valid data storage unit 16. The method includes accessing (block 53), with control circuitry 18, the addressed locations of the set 12 of dual port memory cells and the set 14 of single port memory cells by: performing a single write operation at block 54; performing a simultaneous write operation (block 55) using the write port W of the set 12 of dual port memory cells and the read/write port R/W of the set 14 of single port memory cells, and updating (block 58) corresponding valid bits in the valid data storage unit 16; performing a parallel read operation (blocks 56 and 57), at a same addressed location of the set 12 of dual port memory cells and the set 14 of single port memory cells, using the read port R of the set of dual port memory cells and the read/write port R/W of the set of single port memory cells, and determining (block 59) which stored data word is valid based upon the corresponding valid bits in the valid data storage unit 16, before ending at block 60.

An example of a Truth Table of supported operations (e.g. using read chip select enable RCSN, write chip select enable 1 WCSN1, and write chip select enable 2 WCSN2) includes the following operations performed: 0 0 0=Invalid state, two writes will be given preference (can be customized); 0 0 1=read and write from 1st port; 0 1 0=read on 1st port and write on 2nd port; 0 1 1=read on 1st port; 1 0 0=write on both the ports; 1 0 1=write on 1st port; 1 1 0=write on 2nd port; 1 1 1=No operation.

Thus, a pseudo dual port memory 10 that does not require the use of 2R2W memory cells and provides single cycle operation is described, and the advantages include single cycle operation, non-complex and straight forward implementation, and frequency is not limited by logic and is the same as that of a base 1RW/1R1W memory (which are typically better than a pure dual port 2RW memory).

The above described approach can be extended to N-Write/1Read memory by using one 1RW and "N" 1R1W memories in existing architecture and increasing the width of the valid bit storage unit for each location to n, where n=ceil(log 2(N+1)) to store the unique ID of memory having valid data for each location, in this case there will be N+1 memories. This architecture can be built using RTL in any HDL around single port and dual port memory, which makes this approach technology independent.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A pseudo dual port memory comprising:
   a set of dual port memory cells having a read port and a write port, and configured to store data words in each of a plurality of addressed locations;
   a set of single port memory cells having a read/write port, and configured to store data words in each of a plurality of addressed locations;
   a valid data storage unit configured to store valid bits corresponding to the addressed locations of the set of dual port memory cells and the set of single port memory cells; and
   control circuitry configured to access the addressed locations of the set of dual port memory cells and the set of single port memory cells by
      performing a simultaneous write operation using the write port of the set of dual port memory cells and the read/write port of the set of single port memory cells, and updating corresponding valid bits in the valid data storage unit, and
      performing a parallel read operation, at a same addressed location of the set of dual port memory cells and the set of single port memory cells, using the read port of the set of dual port memory cells and the read/write port of the set of single port memory cells, and determining which stored data word is valid based upon the corresponding valid bits in the valid data storage unit.

2. The pseudo dual port memory according to claim 1 wherein the simultaneous write operation is performed in a single clock cycle.

3. The pseudo dual port memory according to claim 1 wherein the parallel read operation is performed in a single clock cycle.

4. The pseudo dual port memory according to claim 1 wherein the set of dual port memory cells comprises a matrix of 8T memory cells coupled together.

5. The pseudo dual port memory according to claim 1 wherein the set of single port memory cells comprises a matrix of 6T memory cells coupled together.

6. The pseudo dual port memory according to claim 1 wherein the valid data storage unit comprises a plurality of flip flop circuits.

7. The pseudo dual port memory according to claim 1 wherein the number of valid bits of the valid data storage unit corresponds to the number of stored data words of the set of dual port memory cells and the set of single port memory cells.

8. A dual port static random access memory (SRAM) comprising:
   a pseudo dual port memory core comprising a matrix of memory cells coupled in rows and columns including
      a set of dual port memory cells configured to store data words in each of a plurality of addressed locations, and
      a set of single port memory cells configured to store data words in each of a plurality of addressed locations;
   a valid data storage unit configured to store valid bits corresponding to the addressed locations of the set of dual port memory cells and the set of single port memory cells; and
   control circuitry, in connection with the row decoder and column decoder, configured to access the addressed locations of the set of dual port memory cells and the set of single port memory cells by
      performing a simultaneous write operation at respective addressed locations of the set of dual port memory cells and the set of single port memory cells, and updating corresponding valid bits in the valid data storage unit, and
      performing a parallel read operation, at a same addressed location of the set of dual port memory cells and the set of single port memory cells, and determining which stored data word is valid based upon the corresponding valid bits in the valid data storage unit.

9. The dual port SRAM architecture according to claim 8 wherein the set of dual port memory cells have a read port and a write port, and the set of single port memory cells have a read/write port; and wherein the control circuitry is configured to perform the simultaneous write operation using the write port of the set of dual port memory cells and the read/write port of the set of single port memory cells, and perform the parallel read operation using the read port of the set of dual port memory cells and the read/write port of the set of single port memory cells.

10. The dual port SRAM architecture according to claim 8 wherein the simultaneous write operation is performed in a single clock cycle.

11. The dual port SRAM architecture according to claim 8 wherein the parallel read operation is performed in a single clock cycle.

12. The dual port SRAM architecture according to claim 8 wherein the set of dual port memory cells comprises a matrix of 8T memory cells coupled together.

13. The dual port SRAM architecture according to claim 8 wherein the set of single port memory cells comprises a matrix of 6T memory cells coupled together.

14. The dual port SRAM architecture according to claim 8 wherein the valid data storage unit comprises a plurality of flip flop circuits.

15. The dual port SRAM architecture according to claim 8 wherein the number of valid bits of the valid data storage unit corresponds to the number of stored data words of the set of dual port memory cells and the set of single port memory cells.

16. A method of implementing a pseudo dual port memory, the method comprising:
   addressing locations in a set of dual port memory cells having a read port and a write port, and in a set of single port memory cells having a read/write port, to store data words therein;
   storing valid bits, corresponding to the addressed locations of the set of dual port memory cells and the set of single port memory cells in a valid data storage unit; and
   accessing, with control circuitry, the addressed locations of the set of dual port memory cells and the set of single port memory cells by
      performing a simultaneous write operation using the write port of the set of dual port memory cells and the read/write port of the set of single port memory cells, and updating corresponding valid bits in the valid data storage unit, and performing a parallel read operation, at a same addressed location of the set of dual port memory cells and the set of single port memory cells, using the read port of the set of dual port memory cells and the read/write port of the set of single port memory cells, and determining which stored data word is valid based upon the corresponding valid bits in the valid data storage unit.

17. The method according to claim 16 wherein the simultaneous write operation is performed in a single clock cycle.

18. The method according to claim 16 wherein the parallel read operation is performed in a single clock cycle.

19. The method according to claim 16 wherein the set of dual port memory cells comprises a matrix of 8T memory cells coupled together.

20. The method according to claim 16 wherein the set of single port memory cells comprises a matrix of 6T memory cells coupled together.

21. The method according to claim 16 wherein the valid data storage unit comprises a plurality of flip flop circuits.

22. The method according to claim 16 wherein the number of valid bits of the valid data storage unit corresponds to the number of stored data words of the set of dual port memory cells and the set of single port memory cells.

* * * * *